United States Patent
Ho et al.

(10) Patent No.: US 6,858,516 B2
(45) Date of Patent: Feb. 22, 2005

(54) MANUFACTURING METHOD OF A HIGH ASPECT RATIO SHALLOW TRENCH ISOLATION REGION

(75) Inventors: Tzu-En Ho, Ilan (TW); Chang Rong Wu, Banchiau (TW); Hsin-Jung Ho, Shijr (TW)

(73) Assignee: Nanya Technology Corporation, Taoyuan (TW)

( * ) Notice: Subject to any disclaimer, the term of this patent is extended or adjusted under 35 U.S.C. 154(b) by 138 days.

(21) Appl. No.: 10/279,511

(22) Filed: Oct. 23, 2002

(65) Prior Publication Data
US 2003/0203596 A1 Oct. 30, 2003

(30) Foreign Application Priority Data
Apr. 24, 2002 (TW) .......................... 91108471 A

(51) Int. Cl.⁷ .................. H01L 21/8242; H01L 21/76
(52) U.S. Cl. ................ 438/435; 438/243; 438/424; 438/425; 438/426; 438/435; 438/437; 438/524
(58) Field of Search ................... 438/243, 424, 438/425, 426, 435, 437, 524

(56) References Cited

U.S. PATENT DOCUMENTS 5,888,414 A * 3/1999 Collins et al. ................ 216/68
6,180,490 B1 * 1/2001 Vassiliev et al. ............ 438/424

* cited by examiner

Primary Examiner—Nathan J. Flynn
Assistant Examiner—Stanetta D. Issac
(74) Attorney, Agent, or Firm—Ladas & Parry

(57) ABSTRACT

A manufacturing method of a high aspect ratio shallow trench isolation region. A substrate with a trench therein is provided and placed into a chamber. A first insulation layer is formed on the substrate as well as inside the trench by high density plasma chemical vapor deposition. The majority of the first insulation layer outside the trench is removed by in situ etching using carbon fluoride as an etching gas with high selectivity for $SiO_2$/SiN etching ratio, and a second insulation layer is formed on the first insulation layer by high density plasma chemical vapor deposition, filling the trench. According to the present invention, a high aspect ratio shallow trench isolation region without voids can thus be achieved.

15 Claims, 5 Drawing Sheets

MANUFACTURING METHOD OF A HIGH ASPECT RATIO SHALLOW TRENCH ISOLATION REGION

BACKGROUND OF THE INVENTION

1. Field of the Invention

The present invention relates to a method of manufacturing semiconductor integrated circuits. More particularly, the present invention relates to a method of manufacturing a high aspect ratio shallow trench isolation region.

2. Description of the Related Arts

Recently, as the manufacturing techniques of semiconductor integrated circuits develop, the number of elements in a chip increases. The size of the element decreases as the degree of integration increases. The line width used in manufacturing lines has decreased from sub-micron to quarter-micron, or even smaller. However, regardless of the reduction of the size of the element, adequate insulation or isolation must be formed among individual elements in the chip so that good element characteristics can be achieved. This technique is called device isolation technology. The main object is to form an isolation region, and reduce the size of the isolation as much as possible while assuring good isolation to have more chip space for more elements.

Among different element isolation techniques, LOCOS and shallow trench isolation region manufacturing methods are the most commonly used. In particular, as the latter has a small isolation region and can keep the substrate level after the process is finished, it is the semiconductor manufacturing method receiving the most attention. The conventional manufacturing method for a shallow trench isolation region comprises forming a dielectric layer to fill a trench on a substrate by chemical vapor deposition (CVD), and etching back the dielectric layer on the substrate to remove the redundant dielectric layer. However, as the density of the semiconductor integrated circuits increases and the size of the elements decreases, the above mentioned deposition have problems in step coverage and cannot completely fill the trench. This influences the isolation effect among elements.

High density plasma chemical vapor deposition (HDPCVD) has extremely good gap-filling ability and is suitable for fine shallow trench isolation region manufacturing. However, the oxide layer deposited by HDPCVD has a distinctive topography which has to be leveled by chemical mechanical polishing (CMP).

At present, the manufacturing method of a shallow trench isolation region usually utilizes HDPCVD for better step coverage in the trench. To further illustrate the process, the manufacturing method is shown in cross section in FIGS. 1A to 1B.

As shown in FIG. 1A, a shield layer is formed on a substrate 10, for example, a pad oxide layer 11 with a thickness of 50 Å to 200 Å is formed on a silicon substrate 10 by CVD or thermal oxidation, and a silicon nitride layer 12 with a thickness of 1200 Å to 1700 Å is deposited on the pad oxide layer 11 by the CVD. The pad oxide layer 11 and the silicon nitride layer 12 form a shield layer. Next, a photoresist layer is coated on the silicon nitride layer 12 and is patterned using photolithography to expose the portion where the element isolation region is to be formed. The silicon nitride layer 12 and the pad oxide layer 11 are etched sequentially using the photoresist layer as a mask. After the photoresist layer is removed with adequate liquid, the silicon nitride layer 12 and the pad oxide layer 11 are used as a mask to etch silicon substrate 10, and a trench with a thickness of 5000 Å to 6000 Å is formed for the isolation of elements.

Next, as shown in FIG. 1B, thermal oxidation is performed to grow a thin oxide layer 14 with a thickness of 180 Å~220 Å as a liner covering the bottom and sidewall of the trench. After that, HDPCVD is performed, for example using $O_2$ and $SiH_4$ as reactants with Ar or $O_2$ or He sputtering to deposit a silicon dioxide layer 18 as an insulation layer, and the trench is filled as shown in FIG. 1B. The silicon dioxide layer 18 has an undulate surface due to the different density of the trench distribution and the characteristics of HDPCVD.

The manufacturing method of a high aspect ratio shallow trench isolation region presently has the drawback as shown in FIGS. 1C and 1D.

As shown in FIG. 1C, as the opening width of the trench narrows and/or the aspect ratio of the trench increases, for example the opening width is less than 0.15 μm and/or the aspect ratio is larger than 3, the silicon dioxide layer 18 deposited using HDPCVD at present may have voids which result in poor insulation quality of the shallow trench isolation region.

In addition, as shown in FIG. 1D, debris 21 produced during Ar or $O_2$ or He sputtering in HDPCVD may remain inside the trench, and this results in void formation.

SUMMARY OF THE INVENTION

It is therefore a primary object of the present invention to provide a manufacturing method of a shallow trench isolation region to improve the gap-filling ability of the insulation layer and isolation quality among elements.

To obtain the above mentioned object, the present invention provides a manufacturing method of a shallow trench isolation region. The manufacturing method comprises providing a substrate with a trench therein; placing the substrate into a chamber and forming a first insulation layer on the substrate and inside the trench by HDPCVD, removing the majority of the first insulation layer outside the trench by in situ etching using carbon fluoride as etching gas, and forming a second insulation layer on the first insulation layer by HDPCVD to fill the trench. Combining high density plasma chemical vapor deposition and in situ etching for the formation of the element isolation prevents unwanted void formation in the shallow trench isolation region.

According to a preferred embodiment of the present invention, the first oxide layer is formed by HDPCVD with $O_2$ and $SiH_4$ as reactants with Ar or $O_2$ or He sputtering. The in situ etching utilizes carbon fluoride as etching gas, which has high selectivity for $SiO_2$/SiN etching ratio to control the etching profile of the top HDP/sidewall HDP/bottom HDP.

BRIEF DESCRIPTION OF THE DRAWINGS

The present invention will be more fully understood and further advantages will become apparent when reference is made to the following description of the invention and the accompanying drawings in which:

FIG. 1A and 1B show the manufacturing method of a shallow trench isolation region using HDPCVD; FIG. 1C and 1D show the drawback of the prior art.

DETAILED DESCRIPTION OF THE INVENTION

Without intending to limit it in any manner, the present invention will be further illustrated by the following description.

Figure 1A:
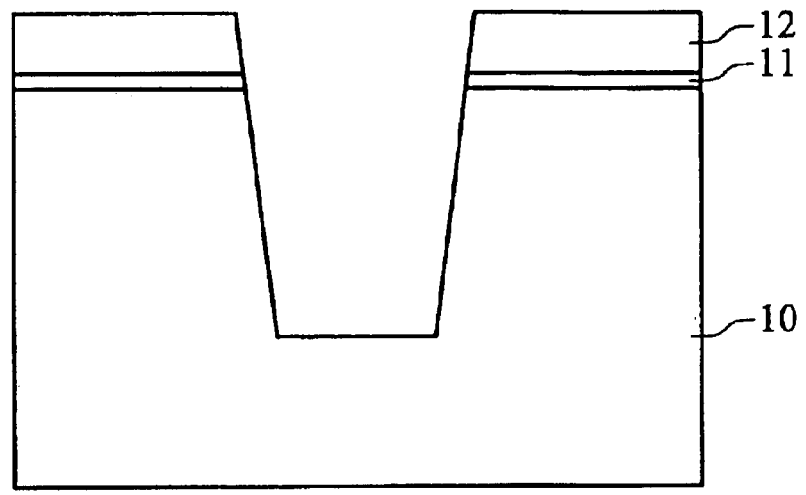
FIGS. 1A–1D are cross sections of the prior art.
Figure 1B:
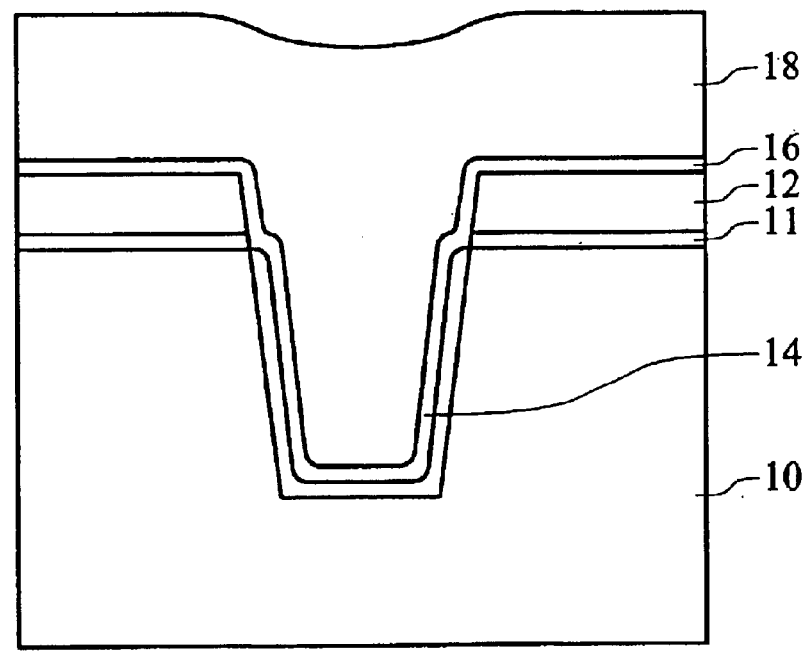
Figure 1C:
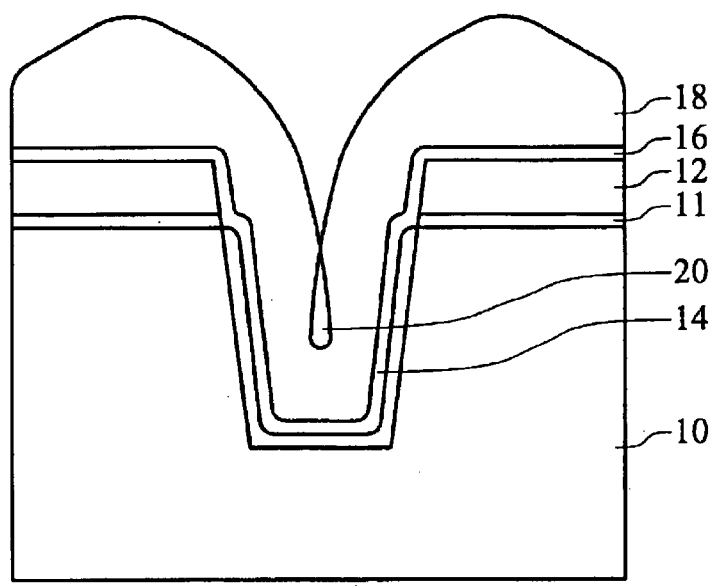
Figure 1D:
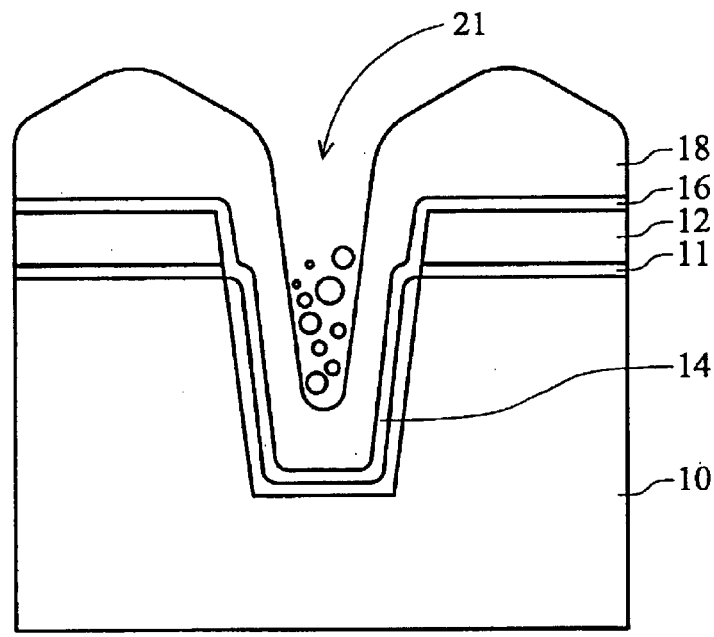
Figure 2A:
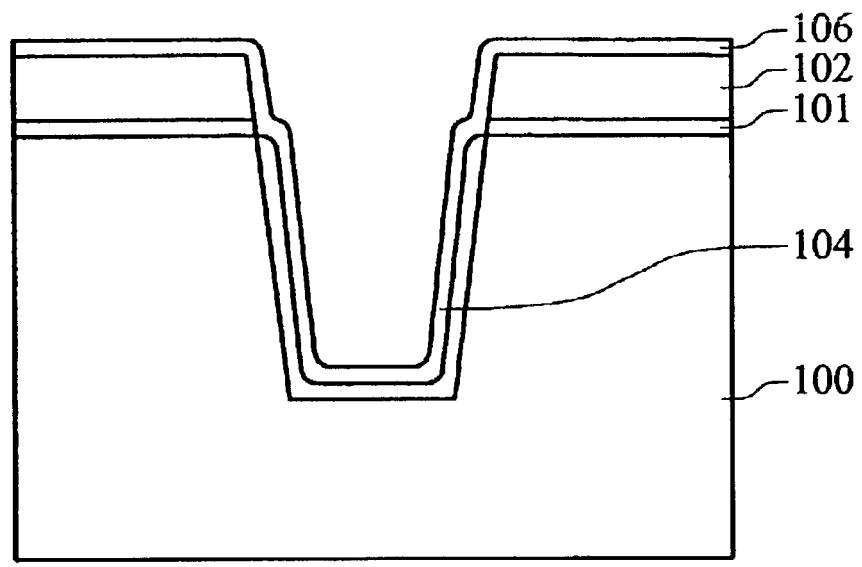
FIGS. 2A–2E are a series of cross sections showing a preferred embodiment of the present invention.

As shown in FIG. 2A, a pad oxide 101 with a thickness of 50 Å to 200 Å is formed on a silicon substrate 100 by CVD or thermal oxidation. A silicon nitride layer 102 with a thickness of 500 Å to 2000 Å is then deposited on the pad oxide layer 101 by CVD. The pad oxide 101 and the silicon nitride layer 102 both form a shield layer. Next, a photoresist layer is coated on the silicon nitride layer 102 and is patterned using photolithography to expose the portion where the element isolation region is to be formed. The silicon nitride layer 102 and the pad oxide layer 101 are etched sequentially using the photoresist layer as a mask. After the photoresist layer is removed with adequate liquid, the silicon nitride layer 102 and the pad oxide layer 101 are used as a mask to etch silicon substrate 100, and a trench with a thickness of 5000 Å to 6000 Å is formed for the element isolation. After that, thermal oxidation is performed to grow a thin oxide layer 104 with a thickness of 180 Å~220 Å as a liner covering the bottom and sidewall of the trench. A thin silicon nitride layer 106 is then formed on the shield layer and also functions as a liner.

Figure 2B:
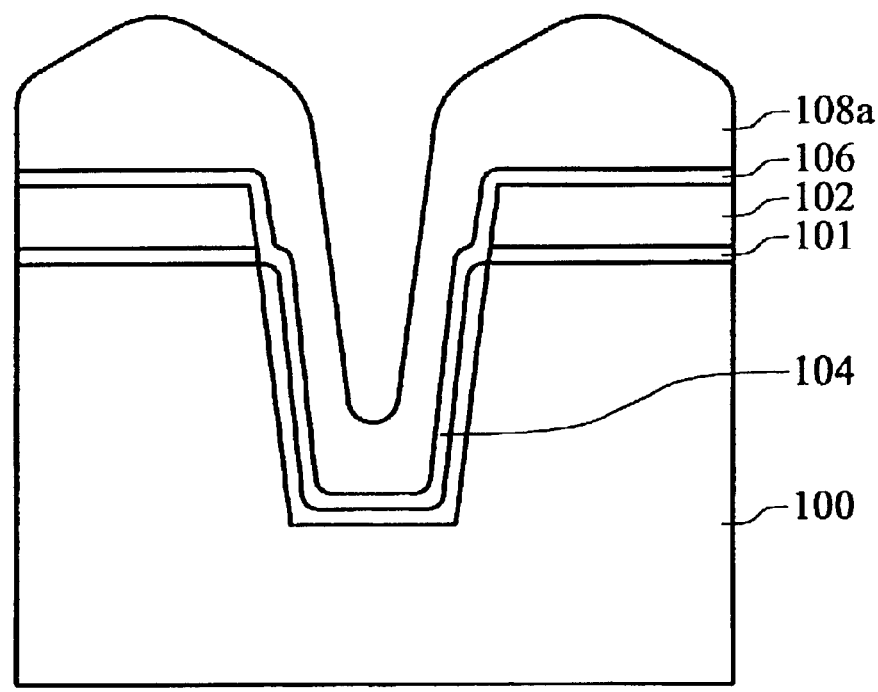

Next, as shown in FIG. 2B, a first high density plasma chemical vapor deposition of the present invention is performed. The substrate 100 is placed into a chamber. A first insulation layer 108a, such as silicon dioxide layer with a thickness of 2500 Å~3500 Å, preferably 3000 Å, is formed on the thin silicon nitride 106 by HDPCVD using $O_2$ and $SiH_4$ as reactants with Ar or $O_2$ or He sputtering. The high density plasma chemical vapor deposition results in a sloped sidewall in the trench.

Figure 2C:
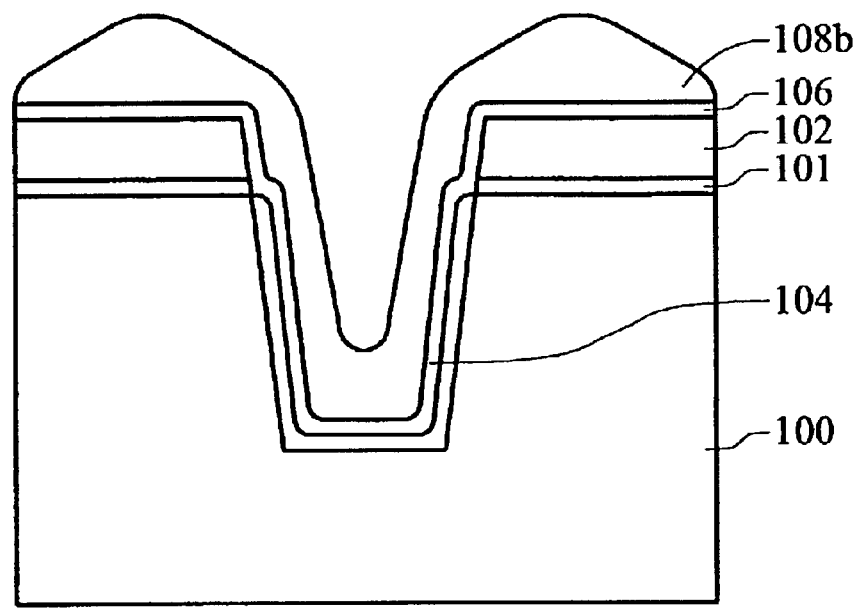

After that, as shown in FIG. 2C, in the same chamber, the redundant deposit on the shield layer is removed by in situ etching technology using carbon fluoride as an etching gas, such as $C_5F_8$ gas carbon fluoride has an advantage of high selectivity for $SiO_2/SiN$ etching ratio (40:1). This controls the etching profile of the top HDP/sidewall HDP/bottom HDP.

Figure 2D:
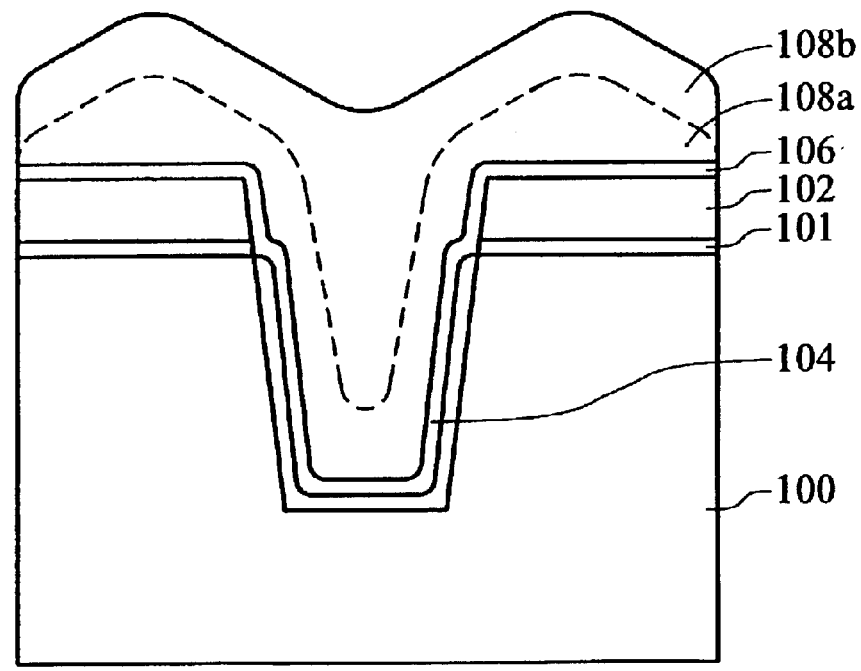

Next, as shown in FIG. 2D, in the same chamber, a second high density plasma chemical vapor deposition is performed to form a second insulation layer 108b on the first insulation layer 108a. The second insulation layer 108b is silicon dioxide layer with a thickness of 2500 Å~3500 Å, preferably 3000 Å. The second insulation layer 108b and the first insulation layer 108a both form an insulation layer 108. This process prevents void formation in the insulation layer.

Figure 2E:
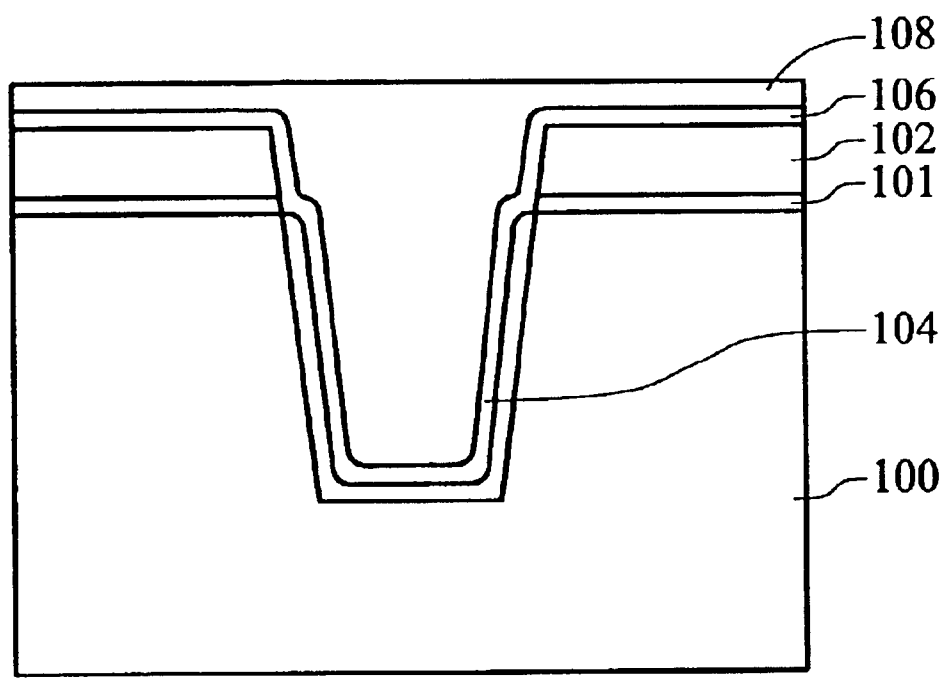

Afterwards, as shown in FIG. 2E, a chemical mechanical polishing is performed to remove uneven insulation layer, including the first and the second insulation layer (108a and 108b), covered on the silicon nitride layer 106 and leave the insulation layer inside the trench. The silicon nitride layer 102 and the pad oxide layer 101 is then removed using adequate liquid or etching to expose the element region. Accordingly, the shallow trench isolation region of the present invention is achieved.

Compared to the prior art, the manufacturing method of a shallow trench isolation region in the present invention has several advantages. First, the present invention prevents void formation in the high aspect ratio shallow trench isolation region. Second, the present invention combines high density plasma chemical vapor deposition and in situ etching, saving treatment time. Moreover, the present invention utilizes etching gas with high selectivity to control the etching profile of the top HDP/sidewall HDP/bottom HDP. Accordingly, the present invention forms a shallow trench isolation region having high aspect ratio without voids, resulting in better quality thereof.

While the invention has been particularly shown and described with the reference to the preferred embodiments thereof, it will be understood by those skilled in the art that various changes in form and details may be made without departing from the spirit and scope of the invention.

What is claimed is:

1. A manufacturing method of a shallow trench isolation region, comprising:
   (a) providing a substrate with a trench therein;
   (b) placing the substrate into a chamber and forming a first insulation layer on the substrate as well as inside the trench by high density plasma chemical vapor deposition (HDPCVD);
   (c) removing the majority of the first insulation layer outside the trench by in situ etching using carbon fluoride as an etching gas; and
   (d) forming a second insulation layer on the first insulation layer by HDPCVD to fill the trench.

2. The method as claimed in claim 1, wherein step (a) further comprises a step of:
   providing the substrate with a shield layer thereon;
   defining a pattern on the shield layer;
   forming the trench on the substrate by etching using the pattern as a mask to expose the substrate;
   forming a thin oxide layer on the bottom and sidewall of the trench by thermal oxidation; and
   forming a thin silicon nitride layer on the shield layer and the thin oxide layer.

3. The method as claimed in claim 2, wherein the shield layer comprises a oxide layer and a silicon nitride layer from the substrate.

4. The method as claimed in claim 1, wherein the aspect ratio of the trench is larger than 3.

5. The method as claimed in claim 1, wherein the HDPCVD of step (b) utilizes $O_2$ and $SiH_4$ as reactants with Ar or $O_2$ or He sputtering to form the first insulation layer.

6. The method as claimed in claim 5, wherein the first insulation layer is silicon dioxide layer.

7. The method as claimed in claim 6, wherein the thickness of the first insulation layer is 2500~3500 Å.

8. The method as claimed in claim 7, wherein the thickness of the first insulation layer is 3000 Å.

9. The method as claimed in claim 1, wherein the carbon fluoride of step (c) comprises $C_5F_8$.

10. The method as claimed in claim 1, wherein the HDPCVD of step (d) utilizes $O_2$ and $SiH_4$ as reactants to form the second insulation layer.

11. The method as claimed in claim 10, wherein the second insulation layer is an oxide layer.

12. The method as claimed in claim 11, wherein the thickness of the second insulation layer is 2500~3500 Å.

13. The method as claimed in claim 12, wherein the thickness of the second insulation layer is 3000 Å.

14. The method as claimed in claim 2, further comprising a step of leveling the insulation layer and the shield layer after step (d).

15. The method as claimed in claim 14, wherein the leveling is accomplished by chemical mechanical polishing (CMP).

* * * * *